United States Patent
Doi et al.

(10) Patent No.: US 10,320,284 B2
(45) Date of Patent: Jun. 11, 2019

(54) INVERTER DEVICE HAVING SHUNT RESISTOR AND PRINTED BOARD WITH CONDUCTIVE PATTERN COMPONENT JOINING SHUNT RESISTOR AND TERMINAL

(71) Applicant: DAIKIN INDUSTRIES, LTD., Osaka-shi, Osaka (JP)

(72) Inventors: Hirotaka Doi, Osaka (JP); Hiroshi Doumae, Osaka (JP); Takuji Koyama, Osaka (JP); Michiya Takezoe, Osaka (JP); Keito Kotera, Osaka (JP); Masahiro Yamamoto, Osaka (JP); Yoshitsugu Koyama, Osaka (JP); Sumio Kagimura, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 15/736,768

(22) PCT Filed: Jun. 8, 2016

(86) PCT No.: PCT/JP2016/067073
§ 371 (c)(1),
(2) Date: Dec. 14, 2017

(87) PCT Pub. No.: WO2016/204044
PCT Pub. Date: Dec. 22, 2016

(65) Prior Publication Data
US 2018/0191240 A1    Jul. 5, 2018

(30) Foreign Application Priority Data

Jun. 17, 2015 (JP) .................................. 2015-122107

(51) Int. Cl.
*H02M 1/34* (2007.01)
*H02M 7/06* (2006.01)
(Continued)

(52) U.S. Cl.
CPC .............. *H02M 1/34* (2013.01); *G01R 1/203* (2013.01); *H01C 13/00* (2013.01); *H02M 7/066* (2013.01);
(Continued)

(58) Field of Classification Search
CPC ........... H02M 2001/0009; H02M 7/48; H02M 7/003; H02M 7/00; H02M 1/34;
(Continued)

(56) References Cited

U.S. PATENT DOCUMENTS

| 1,601,840 A | 10/1926 | Angus | |
| 2003/0038706 A1* | 2/2003 | Nakatsu | H01C 1/14 338/49 |

(Continued)

FOREIGN PATENT DOCUMENTS

| JP | 3826749 B2 | 7/2006 |
| JP | 2009-106036 A | 5/2009 |

(Continued)

OTHER PUBLICATIONS

International Search Report of corresponding PCT Application No. PCT/JP2016/067073 dated Aug. 30, 2016.
(Continued)

*Primary Examiner* — Gustavo A Rosario-Benitez
(74) *Attorney, Agent, or Firm* — Global IP Counselors, LLP

(57) ABSTRACT

An inverter device uses an inverter to convert DC voltage supplied from a rectifying component to AC voltage and applies the AC voltage to an inductive load. The inverter device includes a shunt resistor provided on a direct-current link interconnecting the rectifying component and the inverter, a first terminal passing current to the shunt resistor, a second terminal to which the current from the shunt resistor flows, and a printed board having a conductive (Continued)

pattern with first and second conductive pattern components joining the shunt resistor and the first and second terminals, respectively. The first conductive pattern component includes a first central region connecting right and left side ends of the shunt resistor to right and left side ends of the first terminal, and first right and left side protruding regions. A ratio of areas of the first left and right side protruding regions is 0.6 to 1.6.

11 Claims, 5 Drawing Sheets

(51) Int. Cl.
*H01C 13/00* (2006.01)
*H02M 7/48* (2007.01)
*G01R 1/20* (2006.01)
*H02M 1/00* (2006.01)
*G01R 31/42* (2006.01)

(52) U.S. Cl.
CPC ............... *H02M 7/48* (2013.01); *G01R 31/42* (2013.01); *H02M 2001/0009* (2013.01); *H02M 2001/348* (2013.01); *H05K 2201/09227* (2013.01)

(58) Field of Classification Search
CPC ............ H02M 7/066; H02M 2001/348; H05K 2201/09227; H05K 2201/10022; G01R 1/203; H01C 13/00
See application file for complete search history.

(56) References Cited

U.S. PATENT DOCUMENTS

| 2003/0090241 | A1 | 5/2003 | Nakatsu et al. |
| 2013/0187575 | A1* | 7/2013 | Yugou ..................... H02P 23/14 318/139 |
| 2014/0015636 | A1* | 1/2014 | Tanaka ................... G01R 1/203 338/329 |
| 2014/0266269 | A1* | 9/2014 | Ausserlechner ....... G01R 1/203 324/713 |
| 2015/0245490 | A1 | 8/2015 | Kondou et al. |

FOREIGN PATENT DOCUMENTS

| JP | 2013-187354 A | 9/2013 | |
| JP | 2014-56951 A | 3/2014 | |
| JP | WO 2014041756 A1 * | 3/2014 | ............ G01R 1/203 |
| JP | 2014-89163 A | 5/2014 | |

OTHER PUBLICATIONS

International Preliminary Report of corresponding PCT Application No. PCT/JP2016/067073 dated Dec. 28, 2017.
European Search Report of corresponding EP Application No. 16 81 1519. dated Jun. 8, 2018.

* cited by examiner

INVERTER DEVICE HAVING SHUNT RESISTOR AND PRINTED BOARD WITH CONDUCTIVE PATTERN COMPONENT JOINING SHUNT RESISTOR AND TERMINAL

CROSS-REFERENCE TO RELATED APPLICATIONS

This U.S. National stage application claims priority under 35 U.S.C. § 119(a) to Japanese Patent Application No. 2015-122107, filed in Japan on Jun. 17, 2015, the entire contents of which are hereby incorporated herein by reference.

TECHNICAL FIELD

The present invention relates to an inverter device, and particularly relates to an inverter device in which a shunt resistor is used to detect motor current.

BACKGROUND ART

CT sensors are commonly used to detect motor current in large-capacity inverters, but the use of CT sensors causes an increase in cost because CT sensors are expensive.

To address this problem, there are also inverter devices which, like the one disclosed in Japanese Patent No. 3,826,749 for example, employ a method where a shunt resistor is connected in series to an inverter to detect the current value.

SUMMARY

Technical Problem

However, in the above-described method, plural resistive elements are disposed in parallel to each other to reduce the heat emitted by the resistor, so the paths on which the current flows increase in correspondence thereto, and there is the concern that there will be a drop in the current detection precision depending on the angle at which the current flows into the resistor and the distribution of the current.

Therefore, in Japanese Patent No. 3,826,749, a plate having a large thermal conductivity is anchored to an electrode component to reduce the thermal resistance of the shunt resistor, and a narrow portion is provided between the electrode and the shunt resistor to uniformize the load current distribution in the shunt resistor. However, it can hardly be said that the method of Japanese Patent No. 3,826,749 is realized at a low cost.

It is a problem of the present invention to provide an inverter device whose current detection precision is improved by checking variations in the distribution of current flowing in a shunt resistor without using a separate member.

Solution to Problem

An inverter device pertaining to a first aspect of the present invention is an inverter device that uses an inverter to convert direct-current voltage supplied from a rectifying component to alternating-current voltage and applies the alternating-current voltage to an inductive load, the inverter device comprising a shunt resistor, a first terminal, a second terminal, and a printed board. The shunt resistor is provided on a direct-current link that interconnects the rectifying component and the inverter. The first terminal passes current to the shunt resistor. The current from the shunt resistor flows to the second terminal. The printed board is a board on which is formed a conductive pattern including a first conductive pattern component that joins the shunt resistor and the first terminal to each other and a second conductive pattern component that joins the shunt resistor and the second terminal to each other.

The first conductive pattern component as seen from a position facing the shunt resistor from the first terminal includes a first central region, a first right-side protruding region, and a first left-side protruding region. The first central region is a region that connects a right-side end and a left-side end of the shunt resistor to a right-side end and a left-side end of the first terminal. The first right-side protruding region is a region that juts out on the right side from the first central region. The first left-side protruding region is a region that juts out on the left side from the first central region. A ratio SA2/SA1 of an area SA2 of the first left-side protruding region to an area SA1 of the first right-side protruding region is in the range of 0.6 to 1.6.

In this inverter device, even in a case where the conductive pattern configuring the path on which the current flows from the first terminal to the shunt resistor is large, by setting the ratio SA2/SA1 of the area SA2 of the first left-side protruding region to the area SA1 of the first right-side protruding region in the range of 0.6 to 1.6, variations in the distribution of the current flowing in the shunt resistor can be checked to improve the current detection precision with inexpensive means.

An inverter device pertaining to a second aspect of the present invention is the inverter device pertaining to the first aspect, wherein the second conductive pattern component as seen from a position facing the second terminal from the shunt resistor includes a second central region, a second right-side protruding region, and a second left-side protruding region. The second central region is a region that connects the right-side end and the left-side end of the shunt resistor to a right-side end and a left-side end of the second terminal. The second right-side protruding region is a region that juts out on the right side from the second central region. The second left-side protruding region is a region that juts out on the left side from the second central region. A ratio SB2/SB1 of an area SB2 of the second left-side protruding region to an area SB1 of the second right-side protruding region is in the range of 0.6 to 1.6.

In this inverter device, even in a case where the conductive pattern configuring the path on which the current flows from the shunt resistor to the second terminal is large, by setting the ratio SB2/SB1 of the area SB2 of the second left-side protruding region to the area SB1 of the second right-side protruding region in the range of 0.6 to 1.6, variations in the distribution of the current flowing in the shunt resistor can be controlled to improve the current detection precision with inexpensive means.

An inverter device pertaining to a third aspect of the present invention is the inverter device pertaining to the first aspect or the second aspect, wherein current correcting means is provided in the first conductive pattern component and/or the second conductive pattern component. The current correcting means corrects the direction of the current flowing to the shunt resistor and/or the current flowing from the shunt resistor.

In this inverter device, when the uniformization of the distribution of the current flowing in the shunt resistor cannot be adjusted with just the profile shape of the conductive pattern, it can be adjusted by the current correcting means.

An inverter device pertaining to a fourth aspect of the present invention is the inverter device pertaining to the first aspect, wherein current correcting means that corrects the direction of the current flowing to the shunt resistor is provided in the first conductive pattern component. When the area of the first right-side protruding region and the area of the first left-side protruding region are different and the protruding distance of the first right-side protruding region using the right-side end of the shunt resistor as a reference and the protruding distance of the first left-side protruding region using the left-side end of the shunt resistor as a reference are different, the current correcting means is provided in whichever of the first right-side protruding region and the first left-side protruding region has the larger area and the larger protruding distance.

In this inverter device, when the uniformization of the distribution of the current flowing in the shunt resistor cannot be adjusted with just the profile shape of the conductive pattern, it can be adjusted by the current correcting means.

An inverter device pertaining to a fifth aspect of the present invention is the inverter device pertaining to the second aspect, wherein current correcting means that corrects the direction of the current flowing from the shunt resistor is provided in the second conductive pattern component. When the area of the second right-side protruding region and the area of the second left-side protruding region are different and the protruding distance of the second right-side protruding region using the right-side end of the shunt resistor as a reference and the protruding distance of the second left-side protruding region using the left-side end of the shunt resistor as a reference are different, the current correcting means is provided in whichever of the second right-side protruding region and the second left-side protruding region has the larger area and the larger protruding distance.

In this inverter device, when the uniformization of the distribution of the current flowing in the shunt resistor cannot be adjusted with just the profile shape of the conductive pattern, it can be adjusted by the current correcting means.

An inverter device pertaining to a sixth aspect of the present invention is the inverter device pertaining to any one of the first aspect to the fifth aspect, wherein the shunt resistor is a group of plural resistors connected in parallel to each other.

In this inverter device, the plural resistors are disposed in parallel to each other in order to accommodate a large-current inverter, so it is easy for the distribution of the current flowing in each of the resistors to become nonuniform, but by optimizing the shape of the conductive pattern, imbalance in the current flowing in each of the resistors can be eliminated to improve the current detection precision.

Advantageous Effects of Invention

In the inverter device pertaining to the first aspect of the present invention, even in a case where the conductive pattern configuring the path on which the current flows from the first terminal to the shunt resistor is large, by setting the ratio SA2/SA1 of the area SA2 of the first left-side protruding region to the area SA1 of the first right-side protruding region in the range of 0.6 to 1.6, variations in the distribution of the current flowing in the shunt resistor can be checked to improve the current detection precision with inexpensive means.

In the inverter device pertaining to the second aspect of the present invention, even in a case where the conductive pattern configuring the path on which the current flows from the shunt resistor to the second terminal is large, by setting the ratio SB2/SB1 of the area SB2 of the second left-side protruding region to the area SB1 of the second right-side protruding region in the range of 0.6 to 1.6, variations in the distribution of the current flowing in the shunt resistor can be checked to improve the current detection precision with inexpensive means.

In the inverter device pertaining to any one of the third aspect to the fifth aspect of the present invention, when the uniformization of the distribution of the current flowing in the shunt resistor cannot be adjusted with just the profile shape of the conductive pattern, it can be adjusted by the current correcting means.

In the inverter device pertaining to the sixth aspect of the present invention, the plural resistors are disposed in parallel to each other in order to accommodate a large-current inverter, so it is easy for the distribution of the current flowing in each of the resistors to become nonuniform, but by optimizing the shape of the conductive pattern, imbalance in the current flowing in each of the resistors can be eliminated to improve the current detection precision.

DESCRIPTION OF EMBODIMENT

An embodiment of the present invention will be described below with reference to the drawings. It will be noted that the following embodiment is a specific example of the present invention and is not intended to limit the technical scope of the present invention.

(1) Overview

Figure 1:
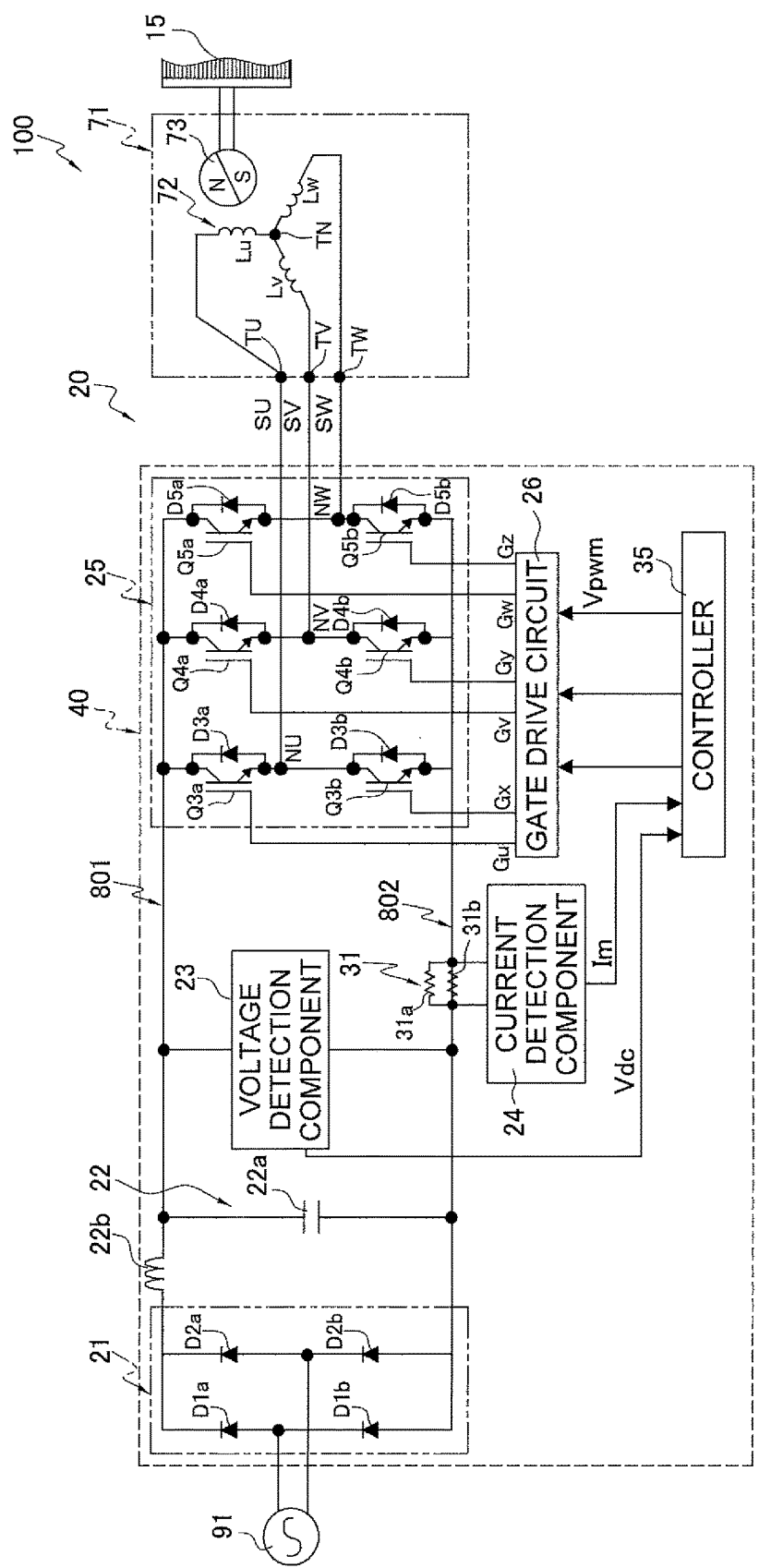
FIG. 1 is a block diagram of a system including an inverter device pertaining to an embodiment of the present invention.

FIG. 1 is a block diagram of a system 100 including an inverter device 20 pertaining to the embodiment of the present invention. In FIG. 1, the system 100 is configured by a motor 71 and the inverter device 20 that controls the driving of the motor 71.

The motor 71 is a 3-phase brushless DC motor and is equipped with a stator 72 and a rotor 73. The stator 72 includes U-phase, V-phase, and W-phase drive coils Lu, Lv, and Lw, which are star-connected.

As shown in FIG. 1, the inverter device 20 is equipped with a rectifying component 21 connected to a commercial power supply 91, a direct-current link component 22 configured by a capacitor 22a, a voltage detection component 23, a current detection component 24, an inverter 25, a gate drive circuit 26, and a controller 35. It will be noted that although a single-phase commercial power supply 91 is shown in FIG. 1, the commercial power supply 91 is not limited to this and may also be a three-phase power supply.

(2) Details of Inverter Device 20

(2-1) Rectifying Component 21

The rectifying component 21 is configured in a bridge arrangement by four diodes D1a, D1b, D2a, and D2b. Specifically, the diodes D1a and D1b and the diodes D2a and D2b are respectively connected to each other in series. The cathode terminals of the diodes D1a and D2a are both connected to a reactor 22b and function as positive-side output terminals of the rectifying component 21. The anode terminals of the diodes D1b and D2b are both connected to a minus-side terminal of the capacitor 22a and function as negative-side output terminals of the rectifying component 21.

The connecting point between the diode D1a and the diode D1b is connected to one pole of the commercial power supply 91. The connecting point between the diode D2a and the diode D2b is connected to the other pole of the commercial power supply 91. The rectifying component 21 rectifies alternating-current voltage output from the commercial power supply 91 to generate direct-current power and supplies this to the capacitor 22a.

(2-2) Direct-Current Link Component 22

The direct-current link component 22 comprises the capacitor 22a and the reactor 22b. One end of the capacitor 22a is connected to direct-current links 801 (on the positive-side output terminal side of the rectifying component 21), and the other end of the capacitor 22b is connected to the direct-current links 802 (on the negative-side output terminal side of the rectifying component 21). The reactor 22b improves the power factor and reduces harmonic current. The capacitor 22a smoothes the voltage rectified by the rectifying component 21. Below, for convenience of explanation, the voltage of the direct-current link component 22 will be called the "direct-current voltage Vdc."

The direct-current voltage Vdc is applied to the inverter 25, which is connected to the output side of the capacitor 22a. In other words, the commercial power supply 91, the rectifying component 21, the reactor 22b, and the capacitor 22a configure a direct-current power supply component that supplies direct-current power to the inverter 25.

(2-3) Voltage Detection Component 23

The voltage detection component 23 is connected to the output side of the capacitor 22a and is for detecting the voltage across the capacitor 22a, that is, the value of the direct-current voltage Vdc. The voltage detection component 23 is configured in such a way that two resistors connected in series to each other are connected in parallel to the capacitor 22a and the direct-current voltage Vdc is divided. The voltage value of the connecting point between the two resistors is input to the controller 35.

(2-4) Current Detection Component 24 and Shunt Resistor 31

The current detection component 24 is configured by an amplifier circuit using an op-amp that amplifies the voltage across a shunt resistor 31. The shunt resistor 31 comprises two resistors 31a and 31b connected in parallel to each other that are connected between the capacitor 22a and the inverter 25 and to the negative-side output terminal side of the capacitor 22a. The current detection component 24 detects motor current Im that flows to the motor 71 after startup of the motor 71. The motor current Im detected by the current detection component 24 is input to the controller 35.

(2-5) Inverter 25

The inverter 25 is connected to the output side of the capacitor 22a. In FIG. 1, the inverter 25 includes plural insulated-gate bipolar transistors (hereinafter simply called "transistors") Q3a, Q3b, Q4a, Q4b, Q5a, and Q5b and plural flyback diodes D3a, D3b, D4a, D4b, D5a, and D5b.

The transistors Q3a and Q3b, the transistors Q4a and Q4b, and the transistors Q5a and Q5b are respectively connected in series to each other, and the diodes D3a to D5b are connected in parallel to the transistors Q3a to Q5b in such a way that the collector terminals of the transistors and the cathode terminals of the diodes are connected to each other and the emitter terminals of the transistors and the anode terminals of the diodes are connected to each other.

The inverter 25 generates drive voltages SU, SV, and SW that drive the motor 71 as a result of the direct-current voltage Vdc from the capacitor 22a being applied and the transistors Q3a to Q5b switching on and off at timings instructed by the gate drive circuit 26. The drive voltages SU, SV, and SW are output to the motor 71 from connecting points NU, NV, and NW between the transistors Q3a and Q3b, the transistors Q4a and Q4b, and the transistors Q5a and Q5b, respectively.

(2-6) Gate Drive Circuit 26

The gate drive circuit 26 changes the on and off states of the transistors Q3a to Q5b of the inverter 25 based on a drive command value Vpwm from the controller 35. Specifically, the gate drive circuit 26 generates gate control voltages Gu, Gx, Gv, Gy, Gw, and Gz that are applied to the gates of the transistors Q3a to Q5b so that the drive voltages SU, SV, and SW having duties decided by the controller 35 are output from the inverter 25 to the motor 71.

The generated gate control voltages Gu, Gx, Gv, Gy, Gw, and Gz are applied to the gate terminals of the transistors Q3a to Q5b.

(2-7) Controller 35

The controller 35 is connected to the voltage detection component 23, the current detection component 24, and the gate drive circuit 26. The controller 35 outputs the drive command value Vpwm to the gate drive circuit 26 based on the result of the voltage detection component 23 and the result of the current detection component 24.

(2-8) Printed Board 40

The rectifying component 21, the direct-current link component 22, the voltage detection component 23, the current detection component 24, the inverter 25, the gate drive circuit 26, the shunt resistor 31, and the controller 35 are mounted on one printed board 40. Additionally, one end of each of the drive coils Lu, Lv, and Lw of the motor 71 is connected to the drive coil terminals TU, TV, and TW, respectively, of U-phase, V-phase, and W-phase lines extending from the inverter 25.

(3) Shape of Conductive Pattern 50 Connected to Shunt Resistor 31

The motor current Im detected by the shunt resistor 31 and the current detection component 24 is input to the controller 35. The controller 35 adjusts the drive command value Vpwm to the gate drive circuit 26 based on the motor current Im, so the precision with which the motor current Im is detected affects the rotational speed control of the motor 71.

It has been confirmed by the research of the applicant that the precision with which the motor current Im is detected fluctuates because of the angle of the current flowing into the shunt resistor 31 and variations in the distribution of the current in the shunt resistor 31. This will be described below using drawings and a graph.

Figure 2:
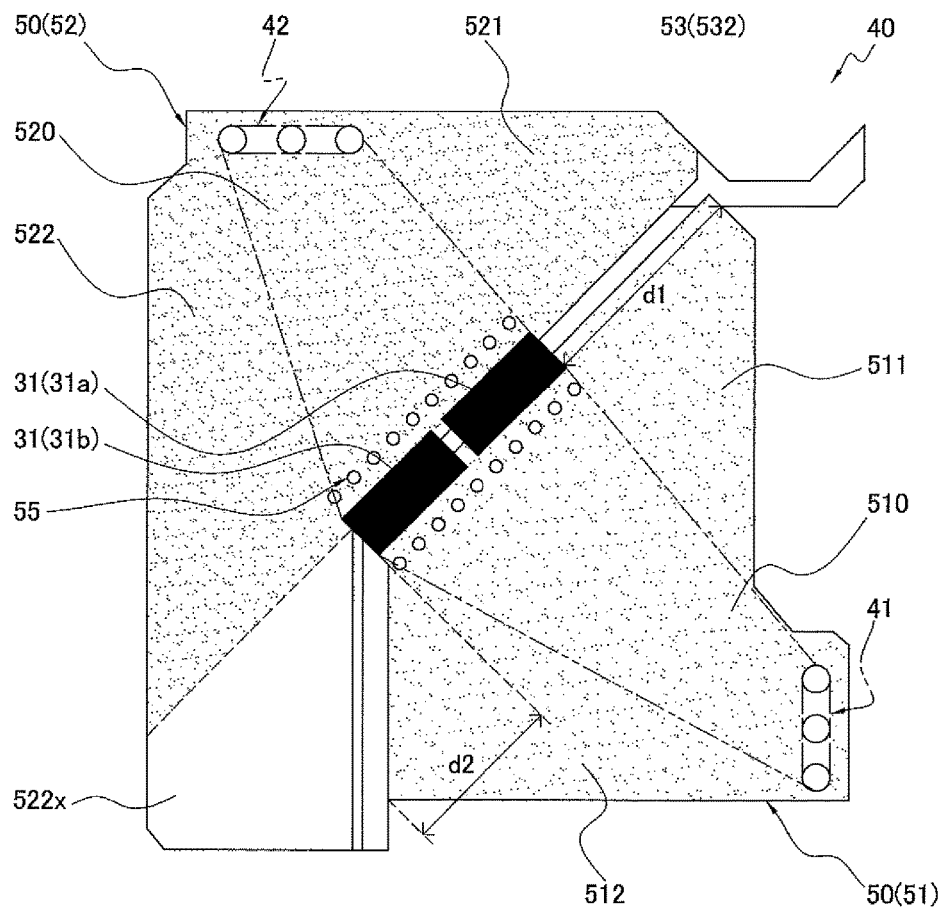
FIG. 2 is a plan view of a conductive pattern connected to a shunt resistor.

FIG. 2 is a plan view of a conductive pattern 50 connected to the shunt resistor 31. In FIG. 2, in the printed board 40, a first conductive pattern component 51 and a second conductive pattern component 52 that are insulated from each other are printed on a board. Furthermore, although it is not shown in the drawings, the printed board 40 is a double-sided board or a multilayer board comprising three or more layers, so a conductive pattern corresponding to the first conductive pattern component 51 and the second conductive pattern component 52 is also printed on the back side.

Current flows in the conductive patterns of the layers, so through holes 55 interconnecting the layers are provided in the immediate vicinity of the shunt resistor 31, and the current flowing in the layers flows via the through holes 55 to the shunt resistor 31.

Additionally, because the shunt resistor 31 is surface-mounted, one electrode of the shunt resistor 31 is connected to the first conductive pattern component 51 and the other electrode is connected to the second conductive pattern component 52, and the first conductive pattern component 51 and the second conductive pattern component 52 are electrically connected to each other via the shunt resistor 31.

(3-1) First Conductive Pattern Component 51

The function of the first conductive pattern component 51 is to electrically interconnect the shunt resistor 31 and a first terminal 41. The first conductive pattern component 51 has, when seen from a position facing the shunt resistor 31 from the first terminal 41, a first central region 510 that connects the right-side end and the left-side end of the shunt resistor 31 to the right-side end and the left-side end of the first terminal 41. Furthermore, the first conductive pattern component 51 also has a first right-side protruding region 511 that juts out on the right side from the first central region 510 and a first left-side protruding region 512 that juts out on the left side from the first central region 510.

It will be noted that "d 1" inscribed on the first conductive pattern component 51 in FIG. 2 denotes the length of a line segment extending perpendicularly from the outermost end of the first right-side protruding region 511 to a plane including the end face of the right-side end of the shunt resistor 31.

Similarly, "d2" inscribed on the first conductive pattern component 51 in FIG. 2 denotes the length of a line segment extending perpendicularly from the outermost end of the first left-side protruding region 512 to a plane including the end face of the left-side end of the shunt resistor 31.

Furthermore, for the sake of convenience in the following description, "d1" and "d2" will be called short sides d1 and d2 in a case where each protruding region is set in a rectangular shape and will be called heights d1 and d2 in a case where each protruding region is set in a trapezoidal shape (or a triangular shape).

(3-2) Second Conductive Pattern Component 52

The function of the second conductive pattern component 52 is to electrically interconnect the shunt resistor 31 and a second terminal 42. The second conductive pattern component 52 has, when seen from a position facing the second terminal 42 from the shunt resistor 31, a second central region 520 that connects the right-side end and the left-side end of the shunt resistor 31 to the right-side end and the left-side end of the second terminal 42. Furthermore, the second conductive pattern component 52 also has a second right-side protruding region 521 that juts out on the right side from the second central region 520 and a second left-side protruding region 522 that juts out on the left side from the second central region 520.

It will be noted that although it appears that the second left-side protruding region 522 includes a non-hatched region 522x in FIG. 2 in the sense that the second left-side protruding region 522 juts out on the left side from the second central region, the region 522x is positioned further away than the shunt resistor 31 as seen from the second terminal 42 and can be said to be a region that does not affect the value of the current flowing from the shunt resistor 31 to the second terminal 42, so it is not included in the second left-side protruding region 522.

(4) Controlling Variations in Current Flowing to Shunt Resistor 31

The current from the first terminal 41 spreads over the first conductive pattern component 51 and enters the shunt resistor 31 not only from the first central region 510 but also through the first right-side protruding region 511 and the first left-side protruding region 512.

In actual use, the shape of the first conductive pattern component 51 is limited because of the first conductive pattern component 51's relation with peripheral parts, and naturally differences arise in the shapes and areas of the first central region 510, the first right-side protruding region 511, and the first left-side protruding region 512, so the current flows at various angles into the shunt resistor 31.

The current flowing out from the shunt resistor 31 spreads over the second conductive pattern component 52 and enters the second terminal not only from the second central region 520 but also through the second right-side protruding region 521 and the second left-side protruding region 522. Additionally, for the same reason as with the first conductive pattern component 51, differences arise in the shapes and areas of the second central region 520, the second right-side protruding region 521, and the second left-side protruding region 522, so the current flows at various angles out from the shunt resistor 31.

For the reasons described above, the angles of the current flowing inside the shunt resistor 31 and the current distribution are not stable, and variations arise in the current detection value.

Thus, in the present embodiment, the fact that variations arise in the current detection value because of the shapes and areas of the first right-side protruding region 511 and the first left-side protruding region 512 is utilized against itself and differences are imparted to the shapes and areas of the first right-side protruding region 511 and the first left-side protruding region 512 so that the current detection value becomes stable. To verify this, experiments measuring the variability in the voltage across the shunt resistor 31 were performed in regard the following three types of conductive patterns for verification experiments.

(4-1) Verification Experiment 1

Figure 3:
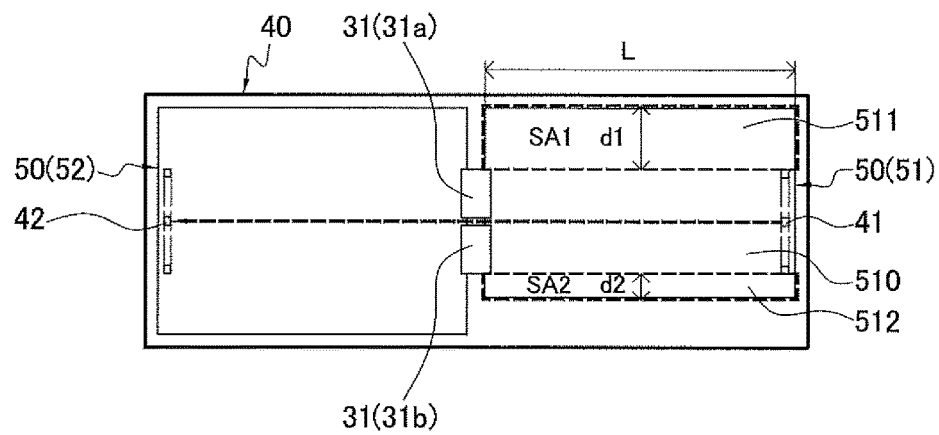
FIG. 3 is a conceptual diagram of a conductive pattern for verification experiment 1.

FIG. 3 is a conceptual diagram of the conductive pattern 50 for verification experiment 1. In FIG. 3, the first conductive pattern component 51 and the second conductive pattern component 52 that are insulated from each other are printed on the printed board 40 for verification experiment 1. The second conductive pattern component 52 is set in a fixed rectangular shape in both shape and area.

The first conductive pattern component 51 has the first right-side protruding region 511, whose shape is a rectangle comprising long sides L having a fixed dimension and short sides d1 having a fixed dimension, and the first left-side protruding region 512, whose shape is a rectangle comprising long sides L having a fixed dimension and short sides d2 having a variable dimension.

The dimension-variable short sides d2 of the first left-side protruding region 512 can be changed in the following way:

0→[0.2×d1]→[0.4×d1]→[0.6×d1]→[0.8×d1]→[d1]→
[1.2×d1]→[1.4×d1]→[1.6×d1]→[1.8×d1]→[2×d1].

(4-2) Verification Experiment 2

Figure 4:
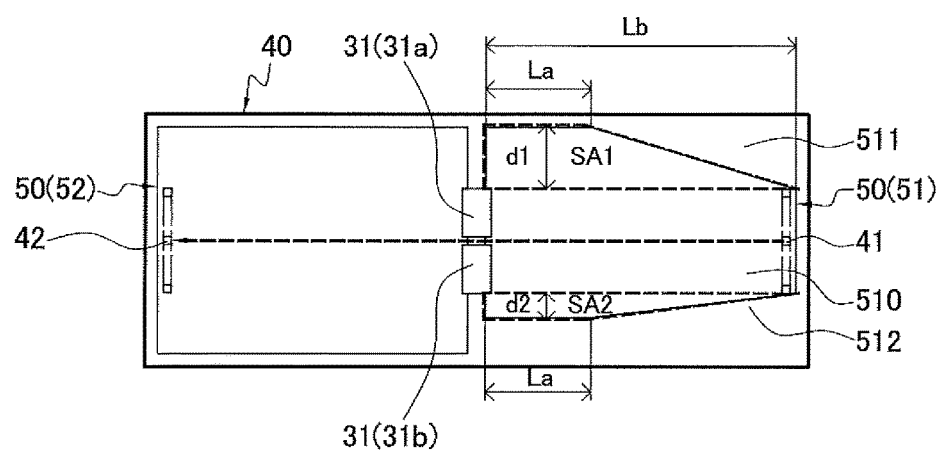
FIG. 4 is a conceptual diagram of a conductive pattern for verification experiment 2.

FIG. 4 is a conceptual diagram of the conductive pattern 50 for verification experiment 2. In FIG. 4, the first conductive pattern component 51 and the second conductive pattern component 52 that are insulated from each other are printed on the printed board 40 for verification experiment 2. The second conductive pattern component 52 is set in a fixed rectangular shape in both shape and area.

The first conductive pattern component 51 has the first right-side protruding region 511, whose shape is a trapezoid comprising a lower base Lb having a fixed dimension, an upper base La having a fixed dimension, and a height d1 having a fixed dimension, and the first left-side protruding region 512, whose shape is a trapezoid comprising a lower base Lb having a fixed dimension, an upper base La having a fixed dimension, and a height d2 having a variable dimension.

The dimension-variable height d2 of the first left-side protruding region 512 can, in the same way as in the first verification experiment, be changed in the following way:
0→[0.2×d1]→[0.4×d1]→[0.6×d1]→[0.8×d1]→[d1]43
[1.2×d1]→[1.4×d1]→[1.6×d1]→[1.8×d1]→[2×d1].

(4-3) Verification Experiment 3

Figure 5:
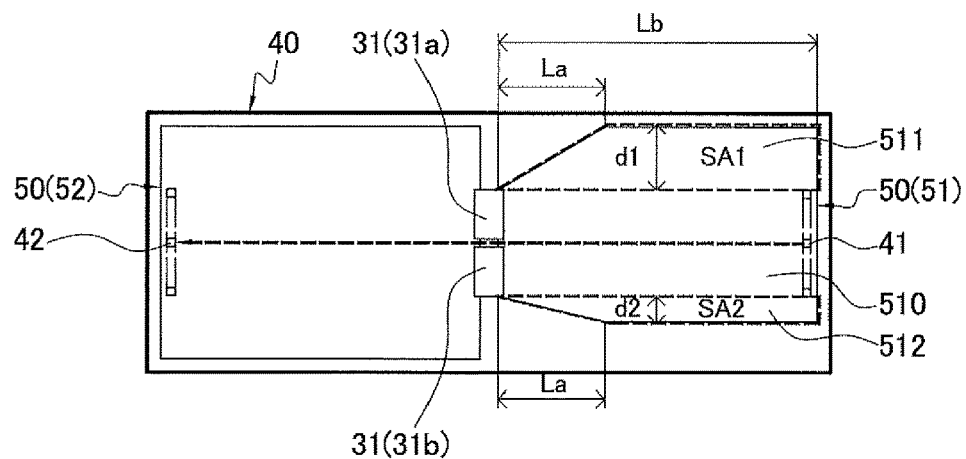
FIG. 5 is a conceptual diagram of a conductive pattern for verification experiment 3.

FIG. 5 is a conceptual diagram of the conductive pattern 50 for verification experiment 3. In FIG. 5, the first conductive pattern component 51 and the second conductive pattern component 52 that are insulated from each other are printed on the printed board 40 for verification experiment 3. The second conductive pattern component 52 is set in a fixed rectangular shape in both shape and area.

The first conductive pattern component 51 has the first right-side protruding region 511, whose shape is a trapezoid comprising a lower base Lb having a fixed dimension, an upper base [Lb−La] having a fixed dimension, and a height d1 having a fixed dimension, and the first left-side protruding region 512, whose shape is a trapezoid comprising a lower base Lb having a fixed dimension, an upper base [Lb−La] having a fixed dimension, and a height d2 having a variable dimension.

The dimension-variable height d2 of the first left-side protruding region 512 can, in the same way as in the first verification experiment and the second verification experiment, be changed in the following way: 0→[0.2×d1]→[0.4× d1]→[0.6×d1]→[0.8×d1]→[d1]→[1.2×d1]→[1.4×d1]→ [1.6×d1]→[1.8×d1]→[2×d1].

(4-4) Experiment Results

Figure 6:
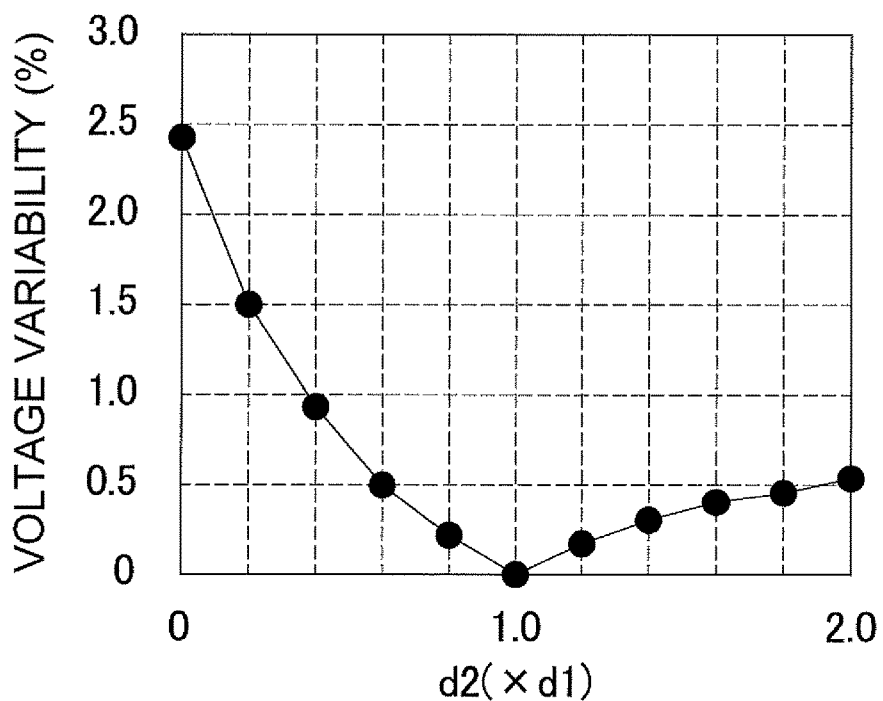
FIG. 6 is a graph showing variability in voltage across the shunt resistor when a minute current has been passed between a first terminal and a second terminal every dimension d2 regarding FIG. 3, FIG. 4, and FIG. 5.

FIG. 6 is a graph showing variability in the voltage across the shunt resistor 31 when a minute current has been passed between the first terminal 41 and the second terminal 42 every dimension d2 regarding FIG. 3, FIG. 4, and FIG. 5. In FIG. 6, the horizontal axis represents the dimension d2 and the vertical axis represents the variability in the voltage across the shunt resistor 31. Here, the voltage variability was calculated using the voltage value when d1=d2 as a reference value, measuring n times every dimension d2, converting to percentages the values increased/decreased from the reference value regarding the n number of measurement values, and finding the mean square error from those. Consequently, the voltage variability is 0 when d1=d2.

As shown in FIG. 6, the variability in the voltage across the shunt resistor 31 drops as d2 of the first left-side protruding region 512 increases and approaches d1 of the first right-side protruding region 511, while in the range of d2>d1 the voltage variability tends to asymptotically approach a value a little over 0.5%.

The allowable range of voltage variability in actual use is within 0.5%, so that which satisfies this is: d2=range of [0.6×d1] to [1.6×d1].

The area SA2 of the first left-side protruding region 512 when d2=[0.6×d1] is $$SA2 = 0.6 \times d1 \times L$$

and the area SA2 of the first left-side protruding region 512 when d2=[1.6×d1] is $$SA2 = 1.6 \times d1 \times L$$

so when "area SA1 of first right-side protruding region 511=d1×L" is used as a reference, $$SA2/SA1 = 0.6 \text{ to } 1.6.$$

That is to say, when the area SA1 of the first right-side protruding region 511 of the first conductive pattern component 51 is used as a reference, it suffices to set the area SA2 of the first left-side protruding region 512 in the range of 0.6 to 1.6 times the area SA1 of the first right-side protruding region 511.

Conversely, when the area SA2 of the first left-side protruding region 512 of the first conductive pattern component 51 is used as a reference, it suffices to set the area SA1 of the first right-side protruding region 511 in the range of 0.6 to 1.6 times the area SA2 of the first left-side protruding region 512.

It will be noted that the same results as those described above are obtained even when the same experiment as was performed with respect to the first conductive pattern component 51 is performed with respect to the second conductive pattern component 52.

(5) Characteristics (5-1)

In the inverter device 20, the conductive pattern 50 including the first conductive pattern component 51 that joins the shunt resistor 31 and the first terminal 41 to each other and the second conductive pattern component 52 that joins the shunt resistor 31 and the second terminal 42 to each other is formed on the printed board 40. The first conductive pattern component 51 as seen from a position facing the shunt resistor 31 from the first terminal 41 includes the first central region 510, the first right-side protruding region 511, and the first left-side protruding region 512. The first right-side protruding region 511 is a region that juts out on the right side from the first central region 510. The first left-side protruding region 512 is a region that juts out on the left side from the first central region 510.

In this inverter device 20, the ratio SA2/SA1 of the area SA2 of the first left-side protruding region 512 to the area SA1 of the first right-side protruding region 511 is set in the range of 0.6 to 1.6, whereby variations in the distribution of the current flowing in the shunt resistor 31 can be checked to improve the current detection precision with inexpensive means.

(5-2)

In the inverter device 20, the second conductive pattern component 52 as seen from a position facing the second terminal 42 from the shunt resistor 31 includes the second central region 520, the second right-side protruding region 521, and the second left-side protruding region 522. The second right-side protruding region 521 is a region that juts out on the right side from the second central region 520. The second left-side protruding region 522 is a region that juts out on the left side from the second central region 520.

In this inverter device 20, the ratio SB2/SB1 of the area SB2 of the second left-side protruding region 522 to the area SB1 of the second right-side protruding region 521 is set in the range of 0.6 to 1.6, whereby variations in the distribution of the current flowing in the shunt resistor 31 can be checked to improve the current detection precision with inexpensive means.

(5-3)

In the inverter device 20, the shunt resistor 31 is a group of plural resistors connected in parallel to each other. The plural resistors 31*a* and 31*b* are disposed in parallel to each other in order to accommodate a large-current inverter, so it is easy for the distribution of the current flowing in each of the resistors 31*a* and 31*b* to become nonuniform, but by optimizing the shape of the first conductive pattern component 51 and/or the second conductive pattern component 52, imbalance in the current flowing in each of the resistors 31*a* and 31*b* can be eliminated to improve the current detection precision.

(6) Modification

Figure 7:
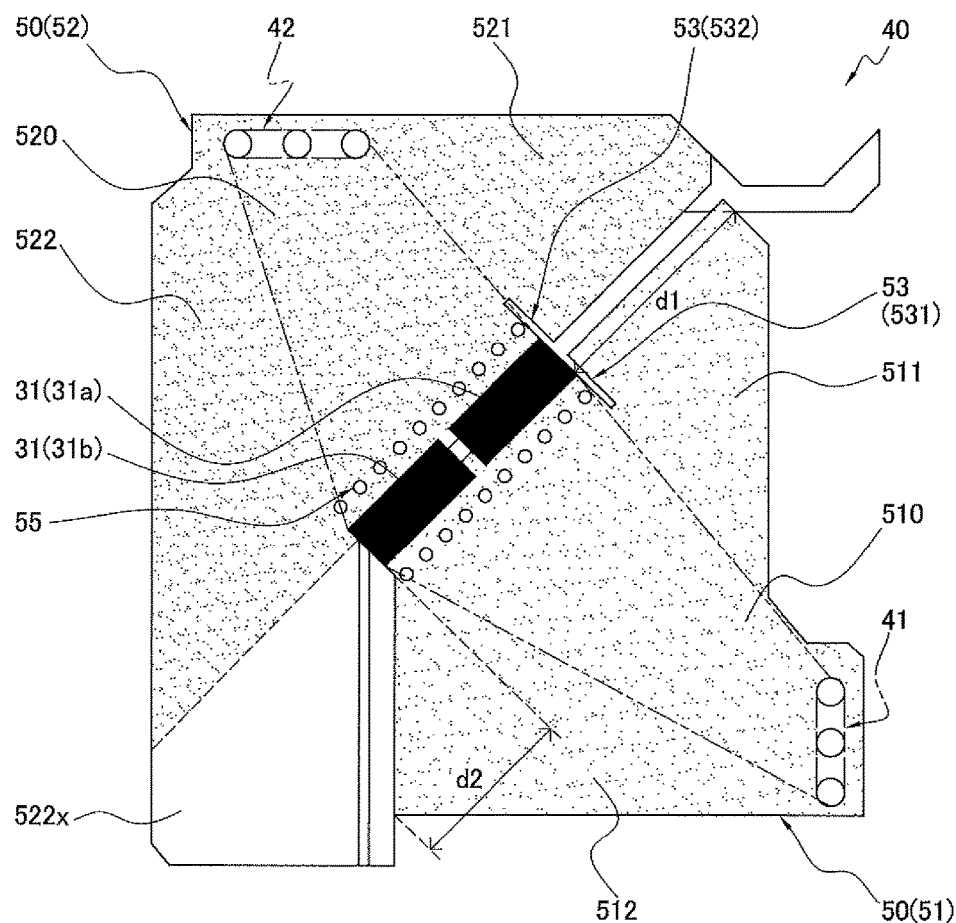
FIG. 7 is a plan view of a conductive pattern pertaining to an example modification.

FIG. 7 is a plan view of the conductive pattern 50 pertaining to an example modification. In FIG. 7, in the printed board 40, a slit 53 serving as a current correcting portion or means is provided in the first conductive pattern component 51 and the second conductive pattern component 52; aside from that, the printed board 40 is the same as the printed board shown in FIG. 2. Consequently, here, only the function of the slit 53 will be described.

The slit 53 is provided in the vicinity of the electrodes of the shunt resistor 31 and checks spreading of the current path in the immediate vicinity of the shunt resistor 31.

In this modification, the slit 53 is provided along the right-side end of the shunt resistor 31 as seen from the first terminal 41. Because of this, by making the width of the conductive pattern 50 connected to the shunt resistor 31 narrower approaching the shunt resistor 31 and adjusting it with the width of the shunt resistor 31 in the immediate vicinity of the shunt resistor 31, spreading of the current path is checked.

For that reason, fine adjustment of the uniformization of the distribution of the current flowing in the shunt resistor 31 that cannot be achieved with just the profile shape of the conductive pattern 50 can be realized by the slit 53.

The first left-side protruding region 512 is adjusted with the left-side end of the shunt resistor 31 in the immediate vicinity of the shunt resistor 31 as seen from the first terminal 41 as shown in FIG. 7, so spreading of the current path is checked without having to provide the slit 53.

Furthermore, assuming that the slit 53 is provided in the first conductive pattern component 51 shown in FIG. 3, FIG. 4, and FIG. 5, when the area SA1 of the first right-side protruding region 511 and the area SA2 of the first left-side protruding region 512 are different and the protruding distance (which corresponds to d1) of the first right-side protruding region 511 using the right-side end of the shunt resistor 31 as a reference and the protruding distance (which corresponds to d2) of the first left-side protruding region 512 using the left-side end of the shunt resistor 31 as a reference are different, the slit 53 should be provided in whichever of the first right-side protruding region 511 and the first left-side protruding region 512 has the larger area and the larger protruding distance.

The reason is because it is easier for the current path to spread in this section. When the uniformization of the distribution of the current flowing in the shunt resistor 31 cannot be adjusted with just the profile shape of the conductive pattern, it can be finely adjusted by providing this slit 53.

The same can also be said regarding the second conductive pattern component 52. Namely, when the area SB1 of the second right-side protruding region 521 and the area SB2 of the second left-side protruding region 522 are different and the protruding distance of the second right-side protruding region 521 using the right-side end of the shunt resistor 31 as a reference and the protruding distance of the second left-side protruding region 522 using the left-side end of the shunt resistor 31 as a reference are different, it is preferred that the slit 53 be provided in whichever of the second right-side protruding region 521 and the second left-side protruding region 522 has the larger area and the larger protruding distance.

What is claimed is:

1. An inverter device that uses an inverter to convert direct-current voltage supplied from a rectifying component to alternating-current voltage and applies the alternating-current voltage to an inductive load, the inverter device comprising:
    a shunt resistor provided on a direct-current link interconnecting the rectifying component and the inverter;
    a first terminal passing current to the shunt resistor;
    a second terminal to which the current from the shunt resistor flows; and
    a printed board with a conductive pattern formed thereon, the conductive pattern including
        a first conductive pattern component that joins the shunt resistor and the first terminal to each other, and
        a second conductive pattern component that joins the shunt resistor and the second terminal to each other,
    the first conductive pattern component, as seen from a position facing the shunt resistor from the first terminal, including
        a first central region connecting a right-side end and a left-side end of the shunt resistor to a right-side end and a left-side end of the first terminal,
        a first right-side protruding region jutting out on a right side from the first central region and extending between the right side end of the shunt resistor and the right side end of the first terminal, and
        a first left-side protruding region jutting out on a left side from the first central region and extending between the left side end of the shunt resistor and the left side end of the first terminal,
    the first right-side protruding region and the first left-side protruding region being different in shape and area, and
    a ratio of an area of the first left-side protruding region to an area of the first right-side protruding region being a first range of 0.6 to 1.6.

2. The inverter device according to claim 1, wherein the second conductive pattern component, as seen from a position facing the second terminal from the shunt resistor, includes
    a second central region connecting the right-side end and the left-side end of the shunt resistor to a right-side end and a left-side end of the second terminal,
    a second right-side protruding region jutting out on the right side from the second central region, and
    a second left-side protruding region jutting out on the left side from the second central region, and
    a ratio of an area of the second left-side protruding region to an area of the second right-side protruding region being in a second range of 0.6 to 1.6.

3. The inverter device according to claim 1, wherein
at least one of the first conductive pattern component and the second conductive pattern component includes a cutout defining an area that corrects a direction of the current flowing to the shunt resistor.

4. An inverter device that uses an inverter to convert direct-current voltage supplied from a rectifying component to alternating-current voltage and applies the alternating-current voltage to an inductive load, the inverter device comprising:
   a shunt resistor provided on a direct-current link interconnecting the rectifying component and the inverter;
   a first terminal passing current to the shunt resistor;
   a second terminal to which the current from the shunt resistor flows; and
   a printed board with a conductive pattern formed thereon, the conductive pattern including
      a first conductive pattern component that joins the shunt resistor and the first terminal to each other, and
      a second conductive pattern component that joins the shunt resistor and the second terminal to each other,
   the first conductive pattern component, as seen from a position facing the shunt resistor from the first terminal, including
      a first central region connecting a right-side end and a left-side end of the shunt resistor to a right-side end and a left-side end of the first terminal,
      a first right-side protruding, region jutting out on a right side from the first central region, and
      a first left-side protruding region jutting out on a left side from the s central region,
      a ratio of an area of the first left-side protruding region to an area of the first right-side protruding region being a first range of 0.6 to 1.6,
   the first conductive pattern component further including a cutout defining an area that corrects a direction of the current flowing to the shunt resistor, and
   when an area of the first right-side protruding region and an area of the first left-side protruding region are different, and when a protruding distance of the first right-side protruding region using the right-side end of the shunt resistor as a reference and a protruding distance of the first left-side protruding region using the left-side end of the shunt resistor as a reference are different,
      the cutout being provided in whichever of the first right-side protruding region and the first left-side protruding region having a larger area and a larger protruding distance.

5. An inverter device that uses an inverter to convert direct-current voltage supplied from a rectifying component to alternating-current voltage and applies the alternating-current voltage to an inductive load, the inverter device comprising:
   a shunt resistor provided on a direct-current link interconnecting the rectifying component and the inverter;
   a first terminal passing current to the shunt resistor;
   a second terminal to which the current from the shunt resistor flows; and
   a printed board with a conductive pattern famed thereon, the conductive pattern including
      a first conductive pattern component that joins the shunt resistor and the first terminal to each other, and
      a second conductive pattern component that joins the shunt resistor and the second terminal to each other,
   the first conductive pattern component, as seen from a position facing the shunt resistor from the first terminal, including
      a first central region connecting a right-side end and a left-side end of the shunt resistor to a right-side end and a left-side end of the first terminal,
      a first right-side protruding region jutting out on a right side from the first central region, and
      a first left-side protruding region jutting out on a left side from the first central region,
      a ratio of an area of the first left-side protruding region to an area of the first right-side protruding region being a first range of 0.6 to 1.6,
   the second conductive pattern component, as seen from a position facing the second terminal from the shunt resistor, including
      a second central region connecting the right-side end and the left-side end of the shunt resistor to a right-side end and a left-side end of the second terminal,
      a second right-side protruding region jutting out on the right side from the second central region, and
      a second left-side protruding region jutting out on the left side from the second central region,
      a ratio of an area of the second left-side protruding region to an area of the second right-side protruding region being in a second range of 0.6 to 1.6,
   the second conductive pattern component including a cutout defining an area that corrects a direction of the current flowing from the shunt resistor, and
   when the area of the second right-side protruding region and the area of the second left-side protruding region are different, and when a protruding distance of the second right-side protruding region using the right-side end of the shunt resistor as a reference and a protruding distance of the second left-side protruding region using the left-side end of the shunt resistor as a reference are different,
      the cutout being provided in whichever of the second right-side protruding region and the second left-side protruding region having a larger area and a larger protruding distance.

6. The inverter device according to claim 1, wherein
the shunt resistor includes a group of plural resistors connected in parallel to each other.

7. The inverter device according to claim 2, wherein
at least one of the first conductive pattern component and the second conductive pattern component includes a cutout defining an area that corrects a direction of the current flowing to the shunt resistor.

8. The inverter device according to claim 2, wherein
the shunt resistor includes a group of plural resistors connected in parallel to each other.

9. The inverter device according to claim 5, wherein
the shunt resistor includes a group of plural resistors connected in parallel to each other.

10. The inverter device according to claim 3, wherein
the shunt resistor includes a group of plural resistors connected in parallel to each other.

11. The inverter device according to claim 4, wherein
the shunt resistor includes a group of plural resistors connected in parallel to each other.

* * * * *